United States Patent
Bolam et al.

(10) Patent No.: US 7,541,829 B1
(45) Date of Patent: Jun. 2, 2009

(54) METHOD FOR CORRECTING FOR ASYMMETRY OF THRESHOLD VOLTAGE SHIFTS

(75) Inventors: Ronald J. Bolam, East Fairfield, VT (US); Terrance W. Kueper, Rochester, MN (US); David P. Paulsen, Dodge Center, MN (US); John E. Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/131,487

(22) Filed: Jun. 2, 2008

(51) Int. Cl.
*G01R 31/00* (2006.01)
(52) U.S. Cl. .................... 324/765; 324/763; 324/158.1
(58) Field of Classification Search .................. None
See application file for complete search history.

(56) References Cited

U.S. PATENT DOCUMENTS

| | | | |
|---|---|---|---|
| 6,521,469 B1 | 2/2003 | La Rosa et al. | |
| 7,009,905 B2 | 3/2006 | Aipperspach et al. | |
| 7,164,612 B1 | 1/2007 | Eleyan et al. | |
| 7,203,264 B2 * | 4/2007 | Lo et al. | 377/64 |
| 2008/0036487 A1 | 2/2008 | Bradley et al. | |
| 2008/0186075 A1 * | 8/2008 | Kim et al. | 327/333 |

OTHER PUBLICATIONS

"Eliminating Negative Bias Instability in Field Effect Transistor Device" Jan. 1, 1975 IBM Technical Bulletin NN75012316, two pages.*
Li, Xiaojum "Deep Submicron CMOS VLSI Circuit Reliability Modeling, Simulation and Design" Dissertation, University of Maryland, College Park, 2005, (211 pages).

* cited by examiner

*Primary Examiner*—Paresh Patel
(74) *Attorney, Agent, or Firm*—King & Spalding LLP

(57) ABSTRACT

A method for correcting of asymmetric shifts in threshold voltage of transistors caused by effects such as negative-bias temperature instability (NBTI) during burn-in. The method may include providing logic patterns to an integrated circuit, such that devices that were stressed during burn-in are relaxed, and devices that suffered less stress during burn-in are stressed.

1 Claim, 7 Drawing Sheets

METHOD FOR CORRECTING FOR ASYMMETRY OF THRESHOLD VOLTAGE SHIFTS

FIELD OF THE INVENTION

This invention relates to the testing and burn-in of integrated circuits, and more specifically to the correction of asymmetric shifts in threshold voltage of transistors caused by effects such as negative-bias temperature instability (NBTI) during burn-in.

BACKGROUND

A burn-in process may be used during the final stages in the manufacturing process of integrated circuits (ICs) to reduce the number of failures in the field. Burn-in consists of accelerating common failure modes of an IC by intentionally operating the IC under stress conditions. Burn-in conditions may include, for example, supply voltages, clock frequencies, and temperatures near or in excess of specifications. In this way, ICs which would otherwise fail early in their operating lifetime are detected during testing and discarded, thus improving the reliability of ICs delivered to customers. A burn-in process is desirable whenever the resulting ICs must have high reliability, such as ICs used in supercomputers and high-end servers.

While burn-in is generally advantageous, it also has some drawbacks, due to the fact that the stress conditions may favor other kinds of failures which the burn-in process does not target. For example, a phenomenon known as negative-bias temperature instability (NBTI) occurs when p-channel metal-oxide-semiconductor field-effect transistors (PFETs) are subjected to a negative gate-to-source bias at high temperatures. NBTI is thought to arise from the interaction between hydrogen and holes at the interface between the gate oxide and the semiconductor. Under ordinary conditions, hydrogen atoms passivate interface traps by terminating dangling bonds. NBTI occurs when the interface contains a high hole concentration at high temperature. Under those conditions, holes from the inversion layer break the bond between hydrogen atoms and interface trap precursors and release hydrogen from the interface. The traps, no longer passivated, capture charge at the interface.

NBTI stress affects the circuit performance of the PFET by shifting the threshold voltage (VT) of the device, which in turn affects the drain current of the PFET. Since the propagation delay depends on the PFET drain current, the ultimate effect of NBTI stress is to increase the propagation delay, i.e., to slow down the logic circuit. With time, the delay exceeds a value acceptable for normal operation, and the IC eventually fails. For modern low-voltage ICs, with supply voltages of the order of 1 V, NBTI-induced failure may occur for VT shifts of only a few tens of millivolts.

The threshold voltage shift due to NBTI is asymmetric, because it mostly affects those PFETs that are exposed to a negative gate-source bias. Since the gate-source bias is directly correlated with current flow in a PFET, the amount of NBTI-induced VT shift depends on the amount of time a PFET is in its conductive state, which in turn depends on the particular voltage patterns applied to the IC during the burn-in phase. Not all PFETs in an IC are in a conductive state for the same amount of time, therefore some PFETs suffer a greater VT shift than others.

The VT shift induced by NBTI is not completely irreversible. When the bias and temperature conditions causing the NBTI stress are removed, the PFET may experience a partial recovery to its previous state. The recovery, however, is typically not complete, and depends on the specific bias and temperature conditions applied during the recovery process.

A known solution to removing NBTI is through a high temperature anneal which partially recovers the VT shift caused by NBTI during burn-in. This solution, however, has two main drawbacks. First, the high temperature can cause damage to the IC, and the anneal is complicated to perform once the module has been mounted on a board. Second, the annealing process reduces the NBTI stress on all affected PFETs, not only on those PFETs that were most seriously affected.

SUMMARY OF THE INVENTION

In one aspect, the invention provides a method for correcting asymmetric threshold voltage shifts in an integrated circuit. The integrated circuit may include a first signal path and a second signal path, where each of the signal paths comprises a plurality of devices, and a first device of the first signal path has a larger initial threshold voltage shift than a second device of the second signal path. The method may include the steps of: scanning a first logic pattern into the first signal path, the first logic pattern causing bias conditions that induce recovery of the threshold voltage shift in the first device; scanning a second logic pattern into the second signal path, the second logic pattern causing bias conditions that induce threshold voltage shift in the second device; and operating the integrated circuit for a sufficient time to substantially equalize the threshold voltage shift of the first and second devices.

BRIEF DESCRIPTION OF THE DRAWINGS

Embodiments of the invention will now be described with reference to the appended drawings in which.

Drawings are only diagrammatic and not to scale. Corresponding elements in different drawings are indicated by the same numerals.

DETAILED DESCRIPTION

Figure 1:
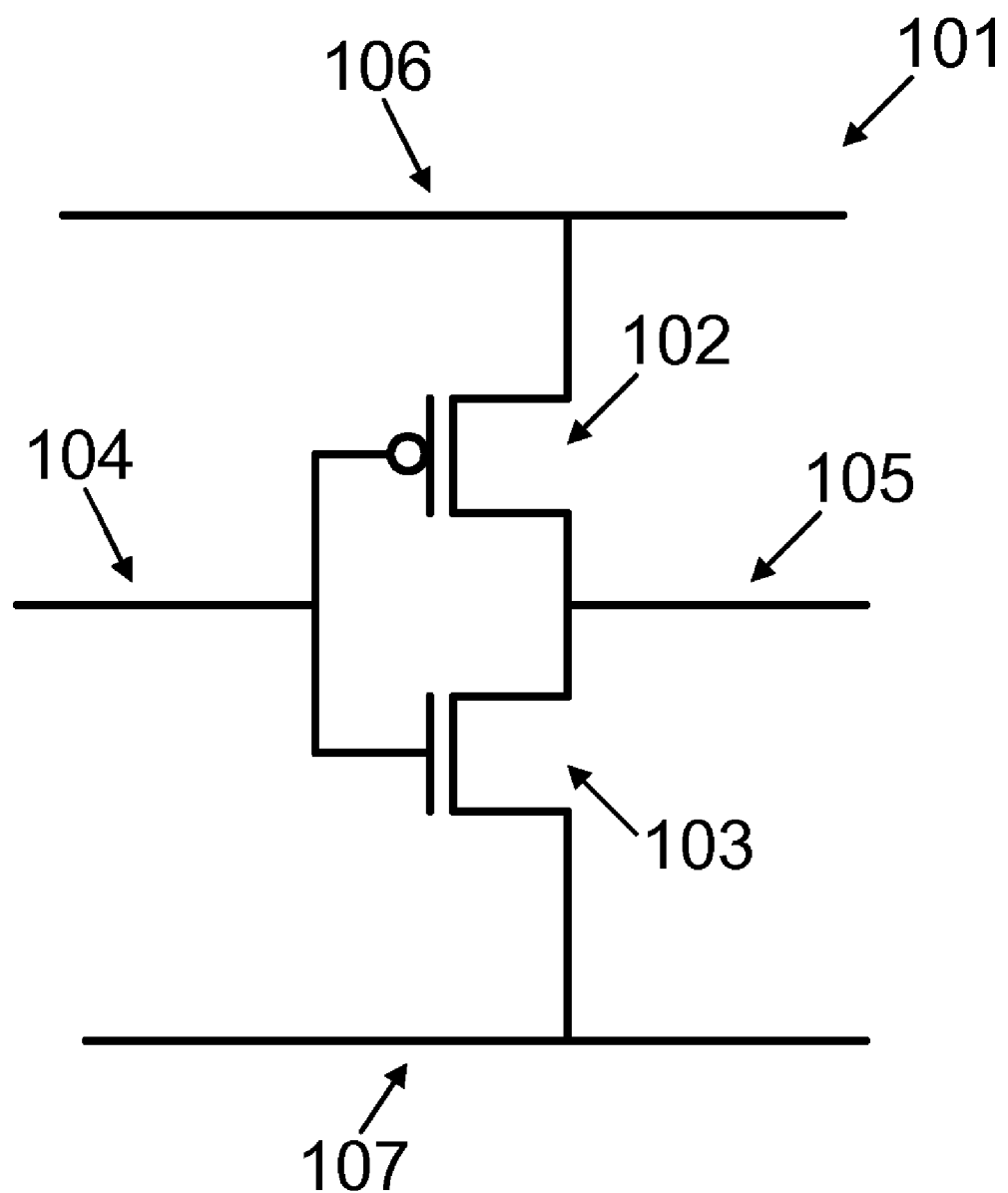
FIG. 1 shows a typical circuit configuration for NBTI stress and recovery in an embodiment of the invention.

FIG. 1 shows a typical circuit configuration for NBTI stress and recovery in an embodiment of the invention. An inverter 101 includes a PFET 102 and an NFET (n-channel field-effect transistor) 103. The inverter receives a logic signal at input terminal 104 and outputs a logic signal at output terminal 105. The inverter is also connected to a supply line 106 and to a ground line 107. When a low voltage is applied to the input 104, the inverter 101 produces a high voltage, equal to the supply voltage, at its output 105. Therefore, PFET 102 is in the conducting state, with the ground voltage applied to its gate, and the supply voltage applied to its source and drain. This is a typical bias condition that may induce NBTI stress at high temperatures. Conversely, when a high voltage is applied to the input 104, the inverter 101 produces a low voltage, equal to the ground voltage, at its output 105. Therefore, PFET 102 is in the non-conducting state, with the ground voltage applied to its drain, and the supply voltage applied to its gate and source. This is a typical bias condition that may facilitate the recovery of any previously induced NBTI stress.

The bias condition corresponding to NBTI stress may be correlated to the logic levels present at the inputs and outputs of a logic gate. For example, a CMOS (complementary-MOS) logic gate includes both PFETs and NFETs, which operate as pull-up and pull-down devices, respectively. The PFETs in a CMOS gate suffer VT shift due to NBTI when the gate's output is high, or "1," since the PFETs are the pull-up devices. Likewise, when the output is low, or "0," the PFETs suffer no VT shift, or may even recover from previous NBTI stress.

Figure 2:
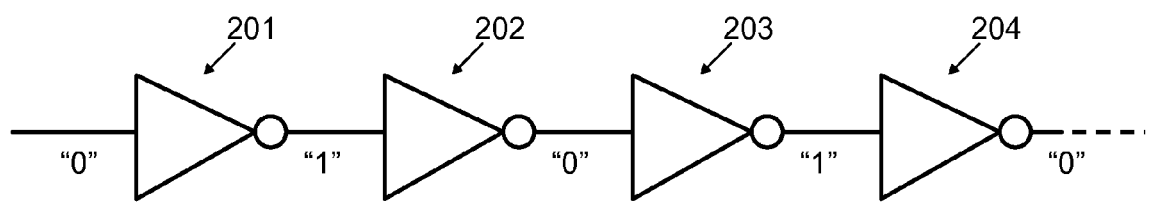
FIG. 2 shows an example of level-dependent NBTI stress on a chain of inverters in an embodiment of the invention.

For signal paths including multiple logic gates, NBTI stress may be directly related to the logic levels present along the path. FIG. 2 shows an example of level-dependent NBTI stress on a chain of inverters in an embodiment of the invention. The chain includes inverters 201, 202, 203, 204, and so on. If the input to the chain is a low voltage level ("0" logic level), inverter 201 suffers NBTI stress, because its output is high ("1"); inverter 202 suffers little or no stress, because its output is low ("0"), and so on. In general, only the odd-numbered inverters (201, 203, and so on) will suffer NBTI stress. Likewise, if the input to the chain of inverters is high ("1"), only the even-numbered inverters (202, 204, and so on) will suffer NBTI stress. For an even number of inverters, or in the limit of a very large number of inverters, the value of the input voltage will not affect the quantitative extent of NBTI stress (e.g., signal delay) because one-half of the inverters will be stressed regardless of whether the input signal is "0" or "1."

Signal paths more complex than a simple chain of inverters may generally experience a degree of NBTI stress which depends on the value of the path's input and output signals. In general, PFETs on certain signal paths will suffer a larger amount of NBTI stress, while other signal paths will suffer little or no stress. This asymmetric NBTI stress may alter the timing of the IC, in particular with respect to critical paths. Asymmetric NBTI stress may even induce timing problems, such as races, in paths that by design should not have such problems. In the context of this description, the term "signal path" indicates any circuit arrangement including a plurality of logic gates, and having one or more inputs and one or more outputs.

The objective of reducing or eliminating the asymmetry in NBTI-induced VT shift may be achieved by applying a cancellation process following burn-in. The cancellation process may apply carefully tailored NBTI stress and relaxation processes to at least partially equalize the delays of signal paths that suffered asymmetric levels of NBTI stress. In this way, the race conditions induced by NBTI may be reduced or eliminated.

Preferably, equalization of the propagation delays may be achieved by adjusting the NBTI-induced VT shift in selected devices of the various signal paths. For example, one or more PFETs of a path that experienced little or no NBTI stress during burn-in may be stressed during a subsequent cancellation process. In addition to intentionally stressing certain devices to induce VT shift, delay may also be equalized by exploiting the recovery properties of NBTI-induced VT shift. For example, one or more PFETs of a path that experienced the largest NBTI stress during burn-in may be relaxed during the cancellation process. Preferably, both stress and recovery effects may be combined. For example, one or more PFETs of a path that was stressed during burn-in may be relaxed, while one or more PFETs of a path that did not experience NBTI during burn-in may be stressed.

The PFETs of specific signal paths may be stressed or relaxed by providing to each path a logic pattern which sets each PFET to a desired state (conductive or non-conductive). For example, the extent of NBTI stress depends on the amount of time a PFET is in a conductive state, which in turn depends on the amount of time the output of the gate is at a high level (logic "1"). Likewise, the amount of recovery depends on the amount of time a PFET is in a non-conductive state, which in turn depends on the amount of time the output of the gate is at a low level (logic "0"). Therefore, a specific pattern of "0" and "1" logic levels can be used to relax a stressed device and to stress an unstressed device. During the cancellation process, the temperature and voltage may be increased to accelerate the NBTI stress and recovery processes, respectively.

Figure 3:
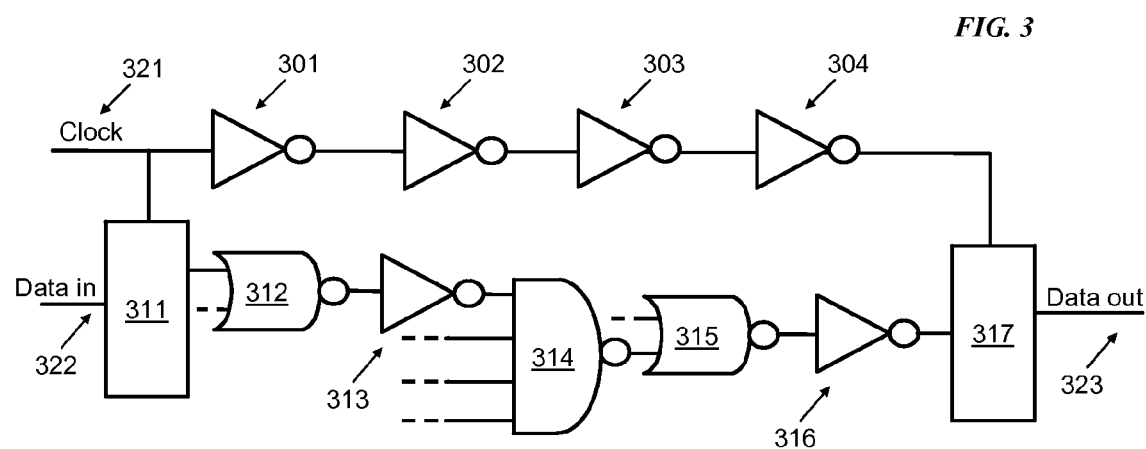
FIG. 3 shows an example of static CMOS signal paths in an embodiment of the invention.

FIG. 3 shows an example of static CMOS signal paths in an embodiment of the invention. This exemplary circuit includes a chain of inverters 301, 302, 303 and 304 distributing a clock signal 321 to an input latch 311 and an output latch 317. The circuit also includes logic gates 312, 313, 314, 315 and 316 propagating a logic signal from input latch 311 to output latch 317. Gates 312, 314 and 315 also receive inputs from other signal paths (shown as dashed lines). Input latch 311 receives a data input from input terminal 322, and output latch 317 provides a data output to output terminal 323. The mixture of inverters, NANDs and NORs in this exemplary circuit is of course only representative and not limiting.

The circuit of FIG. 3 is likely to suffer asymmetric NBTI stress due to the presence of the 4-input NAND gate 314. As is well known, the output of a NAND gate is low only if each of the gate's inputs is high. Assuming that the inputs to the NAND gate 314 are statistically independent and equally likely to assume the values of "0" and "1," the probability of the output of NAND gate 314 to be all high is $2^{-N}$, where N is the number of inputs of the gate. For example, the 4-input NAND gate 314 of FIG. 3 may have a low output only 1/16 of the time, i.e., its output will be high about 94% of the time. Under those assumptions, NAND gate 314 will tend to suffer a large NBTI stress during burn-in because its output is almost always high. Moreover, since the output of the NAND gate 314 is essentially stuck at "1," the output of the NOR gate 315 is almost always low, because a single high input to a NOR gate forces the gate's output to a low level. This means that the NOR gate 315 tends to suffer little or no NBTI stress. However, for the same reason, the subsequent inverter 316 has its output almost always at "1," therefore it tends to suffer a large NBTI stress. As a consequence, the PFETs in gates 314 and 316 may become stressed to the point where the data signal through gates 312-316 races the clock signal along the path through inverters 301-304. Such race condition may eventually lead to a malfunction of the circuit. With respect to the example of FIG. 3, the effect of the stress on gates 314 and 316 may be at least partially canceled by providing to the system appropriate logic levels such that all inputs to NAND gate 314 are high.

Dynamic circuits, which may include separate pre-charge or pulsed paths and data paths, may also have their timing altered by NBTI. Race conditions between pre-charge or pulsed paths and data paths are generally undesirable and avoided by design. However, during burn-in the clocks may be orders of magnitude slower than the typical operating frequencies of an IC. This may cause the data paths to remain conductive for a much longer period of time than the pre-charge or pulsed paths. Therefore, the data paths may suffer a larger VT shift than the pre-charge or pulsed paths. This may also affect performance by creating a race condition that by design should not exist.

Figure 4:
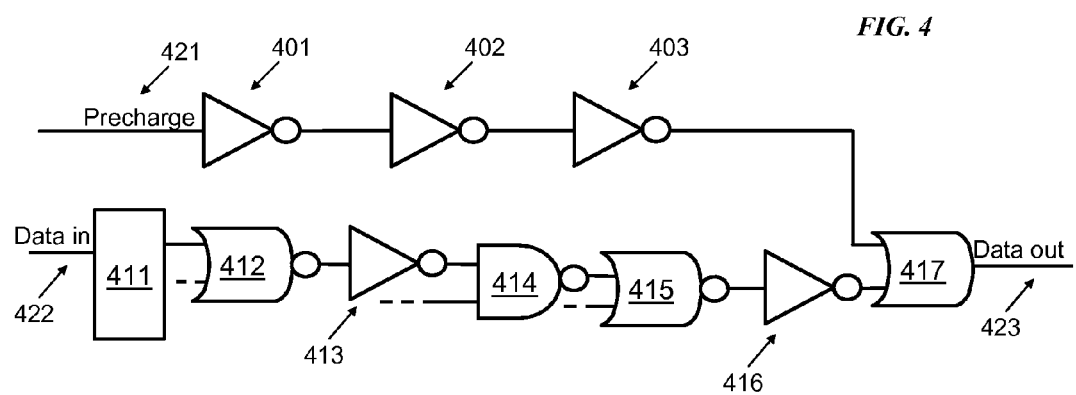
FIG. 4 shows an example of dynamic CMOS signal paths in an embodiment of the invention.

FIG. 4 shows an example of dynamic CMOS signal paths in an embodiment of the invention. This exemplary circuit includes a chain of inverters 401, 402 and 403 distributing a precharge signal 421 to OR gate 417. The circuit also includes logic gates 412, 413, 414, 415 and 416 propagating a logic signal from input latch 411 to OR gate 417. Gates 412, 414 and 415 also receive inputs from other signal paths (shown as dashed lines). Input latch 411 receives a data input from input terminal 422, and OR gate 417 provides a data output to output terminal 423. The mixture of inverters, NANDs and NORs in this exemplary circuit is of course only representative and not limiting.

The circuit of FIG. 4 is likely to suffer asymmetric NBTI stress due to the presence of the precharge path 401-403. Typically, a precharge path is active only a fraction of the time during burn-in, since burn-in frequencies are typically much lower than the actual operating frequencies. Due to this asymmetry, devices along the precharge path tend to remain at constant logic levels. In particular, inverters 401 and 403 will have their output equal to "0" most of the time (i.e., no NBTI stress), whereas inverter 402 will have its output equal to "1" most of the time (i.e., severe NBTI stress). On the other hand, the data path may typically experience a statistically balanced distribution of "0" and "1" logic levels. If the NBTI stress is larger for the data path than for the precharge path, the circuit may malfunction at its design clock frequency due to the occurrence of a race condition between the data and the precharge signal.

For dynamic circuits such as that of FIG. 4, the asymmetries in NBTI stress may be at least partially canceled by providing logic patterns that increase the delay along the precharge path while decreasing the delay along the data path. For example, selected PFETs along the precharge path may be stressed, whereas selected PFETs along the data path may be relaxed. In an embodiment of the invention, logic patterns may be provided which cause recovery in the data path while the precharge path is being pulsed at its actual operating frequency, which may equalize the NBTI stress and attenuate any race conditions.

Figure 5:
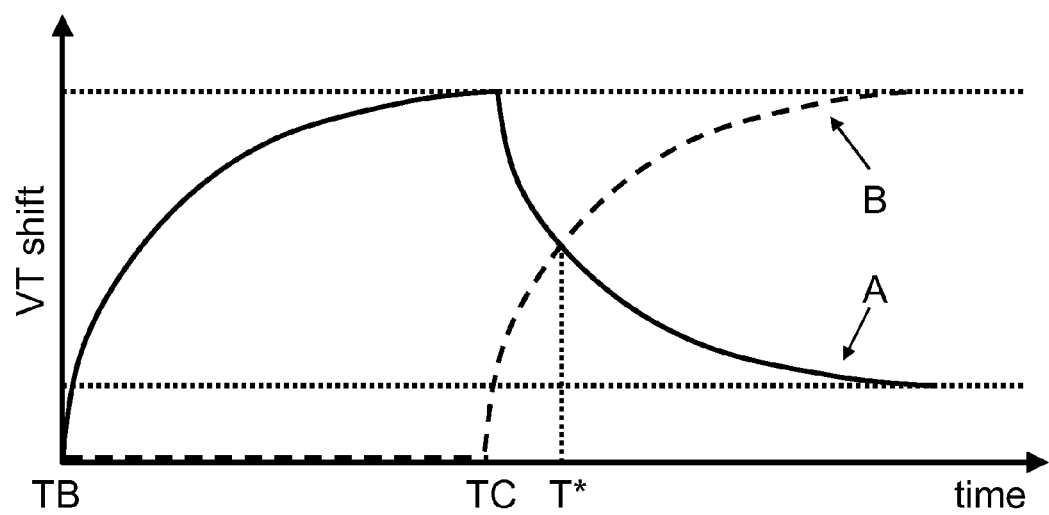
FIG. 5 shows the VT shifts as a function of time during the burn-in and cancellation phase in two complementary paths in an embodiment of the invention.

FIG. 5 shows the VT shifts as a function of time during the burn-in and cancellation phases in two complementary paths in an embodiment of the invention. The VT shifts of two paths, indicated by A and B, are shown in solid and dashed lines, respectively. As discussed above, a signal path includes several devices, each of which may suffer a different degree of NBTI stress. However, for purposes of discussing FIG. 5 only, we assume that all devices along a given signal path are equally stressed during burn-in.

The first half of the diagram in FIG. 5, beginning at time TB, shows the burn-in process. During this phase, path A suffers an NBTI-induced VT shift, whereas path B suffers no VT shift. The second half of the diagram, beginning at time TC, shows the cancellation process which takes place after burn-in. During the cancellation phase, path A is relaxed, whereas path B is stressed. This may be achieved by applying appropriate patterns which cause PFETs in path A to be in a non-conductive state, and PFETs in path B to be in a conductive state. The figure shows that the VT shift of path A is reduced, whereas path B experiences a VT shift. As discussed above, cancellation may be effected at high temperature and/or high voltage to accelerate both stress and recovery processes.

FIG. 5 shows that the recovery of the NBTI stress for path A is not complete, but only amounts to a fraction of the initial shift, as indicated by the two dotted lines marking the full shift and the residual shift, respectively. In general, the amount of recovery will depend on parameters such as device fabrication, bias voltages, temperature, etc. FIG. 5 also shows that the stress and recovery rates are approximately equal. This is assumed in this example only for clarity of illustration, and the equality or even similarity of the rates is not required for the practice of the invention.

The duration of the cancellation phase may be determined in such a way that the final NBTI-induced VT shift is approximately the same for path A and path B. This is marked on FIG. 5 as time T*, where the curves of VT shift for paths A and B intersect. The exact position of time T*, and therefore the duration of the cancellation phase, may be computed from the amount of recovery and the relative rates of stress and recovery. For the sake of illustration, one may assume that the recovery is 20% of the initial shift, and the stress and recovery rates are about the same. One can write an equation correlating the two shifts SA and SB (normalized to the initial shift of path A) as follows:

$$SA = 1 - 0.2\, SB.$$

Setting SA=SB, one obtains a value of both SA and SB equal to 0.83, meaning that substantial equalization is obtained when each of the paths suffers 83% of the initial VT shift of path A.

While a 20% NBTI recovery has been used for purposes of illustration, it is understood that no specific amount of recovery is required for the practice of the invention. The optimum duration of the cancellation process may be determined for any extent of recovery and for any combination of the stress and recovery rates, from a simple analysis as outlined above. The quantitative extent of recovery, which is highly technology-dependent, may of course affect the final result. However, the invention equally applies to any amount of recovery that the underlying technology makes available, and even to the case of no recovery at all (i.e., irreversible VT shift).

Figure 6:
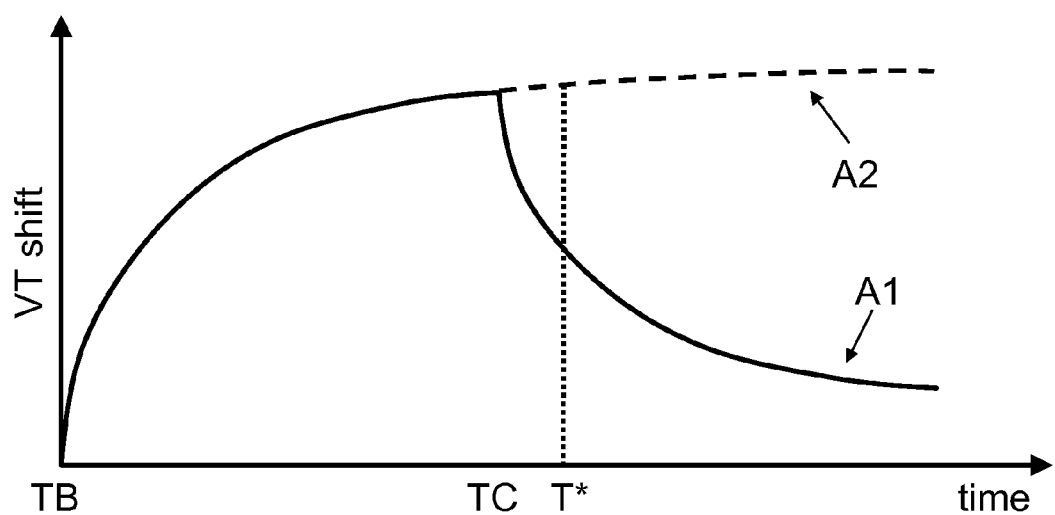
FIG. 6 shows the VT shifts as a function of time during the burn-in and cancellation phases for two devices in the same path in an embodiment of the invention.

The examples of FIGS. 2-4 show that in inverting logic circuits, NBTI stress may be different at various points along a signal path. For example, in the inverter chain of FIG. 2, even and odd stages suffer different degrees of NBTI stress for the same logic input. If cancellation requires increasing NBTI stress along a signal path, the effect may be achieved by stressing an appropriate subset of the devices. If instead cancellation requires relaxing NBTI stress along a given path, the effect may be achieved by selectively relaxing devices that are capable of substantial relaxation, while stressing devices whose VT shift has already saturated and will only experience a small additional VT shift due to the further NBTI stress. To illustrate, FIG. 6 shows the VT shifts as a function of time during the burn-in and cancellation phases for two devices in the same path in an embodiment of the invention. Two devices, labeled A1 and A2, are subjected to the same level of NBTI stress during burn-in. During recovery, device A1 is relaxed, whereas device A2 is further stressed. However, due to the saturating behavior of NBTI stress, the effect of the additional stress on device A2 is negligible, whereas the recovery of device A1 may be significant, resulting in a net speedup of the signal path including both devices A1 and A2.

Figure 7:
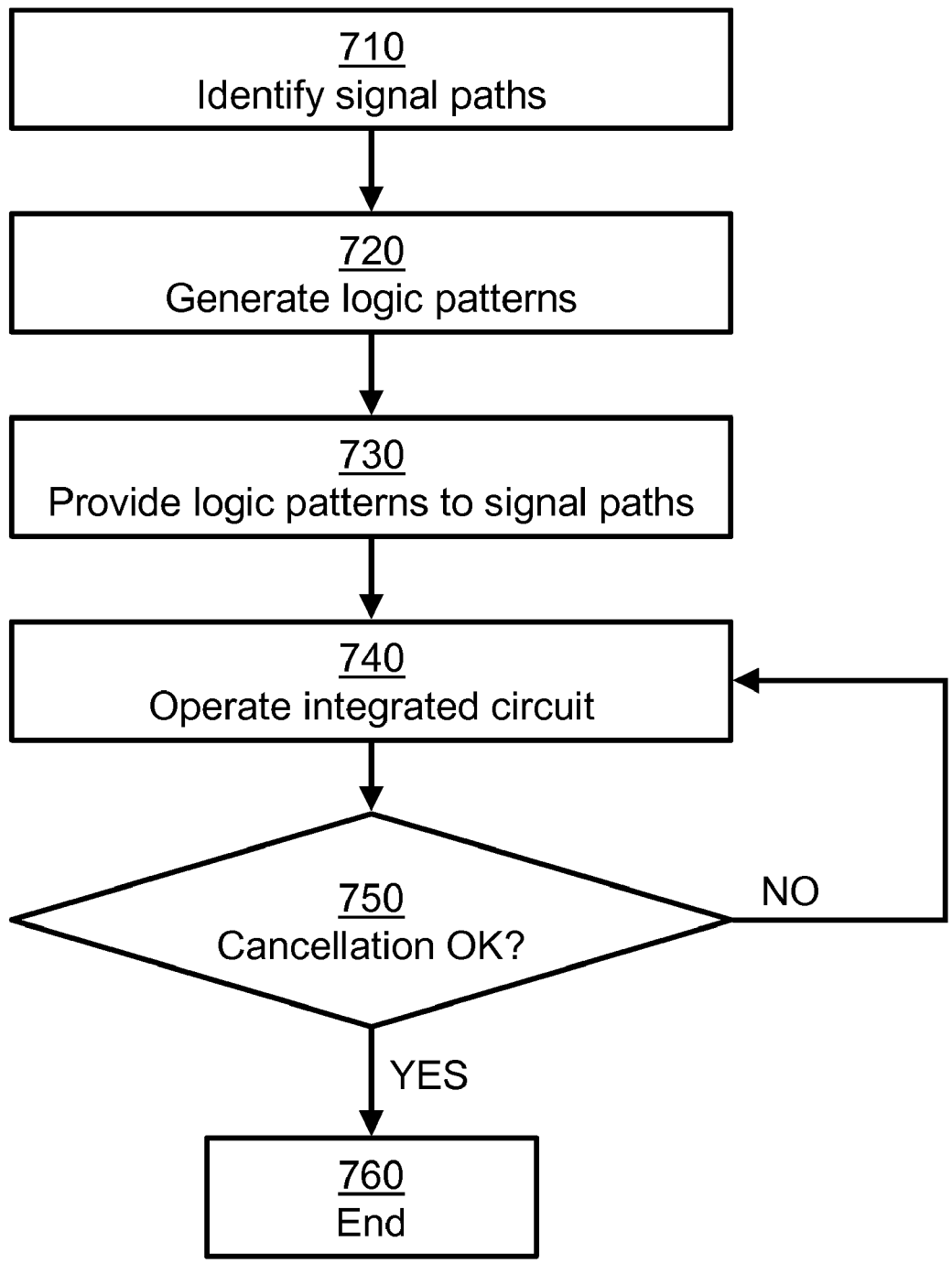
FIG. 7 shows a flow chart illustrating a method for correcting asymmetric threshold voltage shifts in an integrated circuit in an embodiment of the invention.

FIG. 7 shows a flow chart illustrating a method for correcting asymmetric threshold voltage shifts in an integrated circuit in an embodiment of the invention. The method may begin at step 710, where one or more signal paths may be identified which require compensation for NBTI stress. For example, specific signal paths may include PFETs that require stress or relaxation after burn-in. This may be done empirically by isolating paths that tend to fail after burn-in. Alternatively, the logic design may be analyzed to identify paths that are prone to asymmetric stress during burn-in. Such analysis methods are well known in the art. In an embodiment of the invention, the cancellation process may be applied to all paths in a subsystem of the IC or to all paths in the IC, so that the path identification step becomes trivial.

At step 720, logic patterns may be generated for each path, where the logic patterns are configured to set selected devices in a given path to a desired logic state. In particular, PFETs that require further NBTI stress are set to a conducting state ("1"), whereas PFETs that require relaxation are set to a non-conducting state ("0"). The generation of logic patterns is well known in the art.

At step 730, logic patterns may be provided to each path. Logic patterns are preferably scanned-in using level-sensitive scan design (LSSD) ports. LSSD ports are a dedicated set of inputs separate from functional inputs and are used in most current designs. However, other methods may be used to provide appropriate logic patterns, for example by using functional design at a higher level of abstraction.

At step 740, the integrated circuit may be operated for a predetermined amount of time, which may be determined empirically or by a calculation such as that discussed in reference to FIG. 5. The duration of the NBTI cancellation process may also be determined from technology device models and transistor characteristics.

At step 750, the method may determine whether cancellation is satisfactory. If cancellation is satisfactory, the method may terminate at step 760. Otherwise, the method returns to step 740. The loop-termination test of step 750 may be implemented in several ways. In an embodiment of the invention, cancellation may be performed in an open-loop fashion, i.e., without a termination test. However, in a preferred embodiment, additional characterization may be performed to determine if the propagation delays of the paths are satisfactorily equalized. For example, this may occur when the VT shifts of selected devices in different paths are sufficiently equalized, so that the associated propagation delays are sufficiently close. The determination may be advantageously carried out by measuring the minimum supply voltage at which the IC operates correctly for a fixed combination of temperature and clock frequency. In that case, cancellation may be deemed to be satisfactory if the IC can operate at a sufficiently low supply voltage.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

While the invention has been described in conjunction with specific embodiments, it will be appreciated that such embodiments are not limiting. For example, while the description of the preferred embodiments has focused on p-channel transistors, it is understood that the same methods may be applied to threshold voltage shifts in n-channel transistors by simply reversing polarities. Likewise, while the description of the preferred embodiments addressed the specific example of VT shifts induced by NBTI, the invention equally applies to all sources of disturbance associated with the bias voltages applied to the devices, such as hot-carrier damage, time-dependent dielectric breakdown, electromigration, etc. Accordingly, numerous alternatives, modifications, and variations are possible within the scope of the appended claims.

We claim:

1. A method for correcting asymmetric threshold voltage shifts caused by negative-bias temperature instability (NBTI) during burn-in in an integrated circuit, the integrated circuit comprising a first signal path and a second signal path, each of the signal paths comprising a plurality of devices, a first device of the first signal path having a larger initial threshold voltage shift than a second device of the second signal path, the method comprising:

scanning a first logic pattern into the first signal path, the first logic pattern causing bias conditions that induce recovery of the threshold voltage shift in the first device;

scanning a second logic pattern into the second signal path, the second logic pattern causing bias conditions that induce threshold voltage shift in the second device; and operating the integrated circuit for a sufficient time to substantially equalize the threshold voltage shift of the first and second devices.

* * * * *